United States Patent [19]

Monk

[11] Patent Number: 4,616,345
[45] Date of Patent: Oct. 7, 1986

[54] SEMICONDUCTOR MEMORY

[75] Inventor: Trevor K. Monk, Bexley, England

[73] Assignee: ITT Industries, Inc., New York, N.Y.

[21] Appl. No.: 558,421

[22] Filed: Dec. 5, 1983

[30] Foreign Application Priority Data

Dec. 7, 1982 [GB] United Kingdom ................ 8234844
Dec. 22, 1982 [GB] United Kingdom ................ 8236510

[51] Int. Cl.⁴ .............................................. G11C 7/00
[52] U.S. Cl. .................................... 365/226; 365/230
[58] Field of Search ................ 365/189, 226, 227, 230

[56] References Cited

U.S. PATENT DOCUMENTS 3,803,554  4/1974  Bock et al. .......................... 365/227
4,094,012  6/1978  Perlegos et al. .................... 365/226
4,096,584  6/1978  Owen, III et al. .................. 365/227
4,470,133  9/1984  Tanimoto ........................... 365/227

Primary Examiner—Joseph A. Popek
Attorney, Agent, or Firm—Donald J. Lenkszus

[57] ABSTRACT

The NOR decoders of a static random access memory are divided into two or more sets only one of which is powered up at any one time. This significantly reduces the power dissipation of the memory and allows the device to be operational under high access speed conditions. In a preferred arrangement each decoding node is clamped to a voltage level significantly lower than the circuit supply voltage. This provides an increase in operating speed by reducing the deselection time.

5 Claims, 4 Drawing Figures

SEMICONDUCTOR MEMORY

This invention relates to semiconductor memories and in particular to static random access memories.

Semiconductor memories, e.g. of the NMOS static random access type store data in the form of binary digits in arrays of memory cell. Retrieval of this data is effected via decoder circuits which access a particular cell or cells to be read. It will be apparent that, to prevent data corruption, the decoder output signals corresponding to the cells to be accessed must not introduce overlapping of adjacent signals or there will be a risk of data corruption caused by accessing two cells at once.

In such a memory, the memory cells are arranged in a two-dimensional array of m rows and n columns. This array may be physically divided into 2 or more sub-arrays for layout or operating reasons. A cell is accessed by means of X-decoders and Y-decoders which connect the cell to the input/output circuitry. Thus there are m X-decoders and n Y-decoders.

It is a requirement of a static random access memory that the access time to any particular cell shall be as short as possible to ensure a high speed of operation. One of the limiting factors on operating speed is the particular construction and operation conditions of the decoder circuitry whereby individual cells of the memory array are accessed. In general the speed of operation of such a circuit is related to the quiescent current passed by the circuit. An increase in this current corresponds to an increase in speed.

The disadvantage of this high speed operation is of course the excessive power drain that is experienced with the large decoder array required for a large memory. In such a situation this power requirement may prove a limitation on the access time of the memory.

According to the invention there is provided a static random access semiconductor memory, including sets of memory cells, said memory cells being divided logically into two or more sets, row-decoder sets one for each memory cell set whereby the cells of that set can be accessed, and means whereby, when a memory cell is accessed, power is supplied only to that one of the decoder sets corresponding to the accessed cell.

Since only a portion of the total decoder circuitry is powered up at any one time the constraints on power dissipation are considerably released without impairment to the operating speed of the memory. Typically the memory cells are laid out in two similar arrays, but in some applications a larger number of subdivisions may be employed.

Typically the memory is fabricated by a high speed high density n-channel HMOS process.

In a preferred arrangement the decoder circuit includes a plurality of field effect transistors, one for each address input and each coupled between the circuit ground and a decoding node. Voltage clamp means limits the voltage of the decoding node to a value significantly less than the circuit supply voltage.

An embodiment of the invention will now be described with reference to the accompanying drawings in which.

Figure 4:
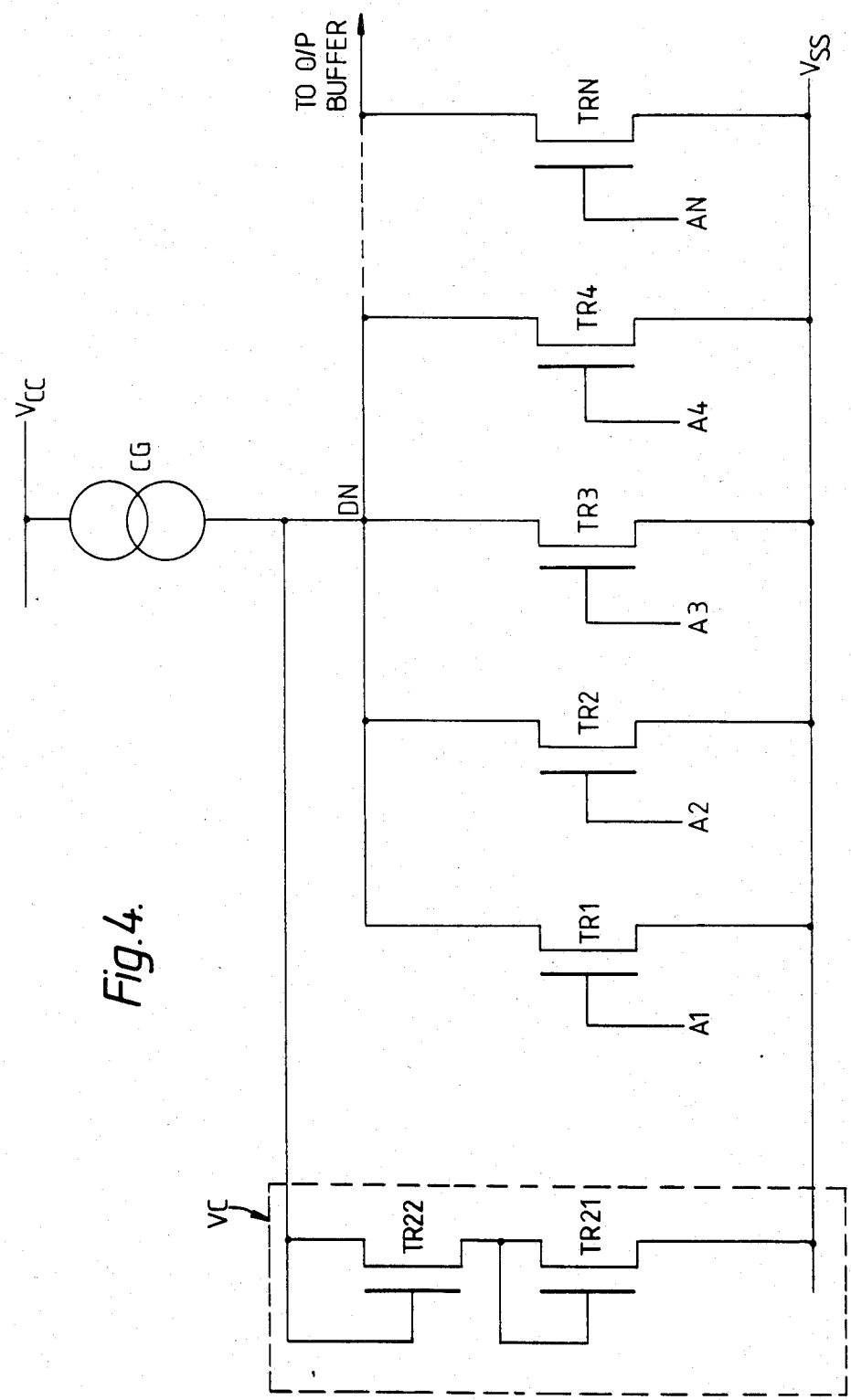

and FIG. 4 shows a preferred form of decoding node.

Figure 1:
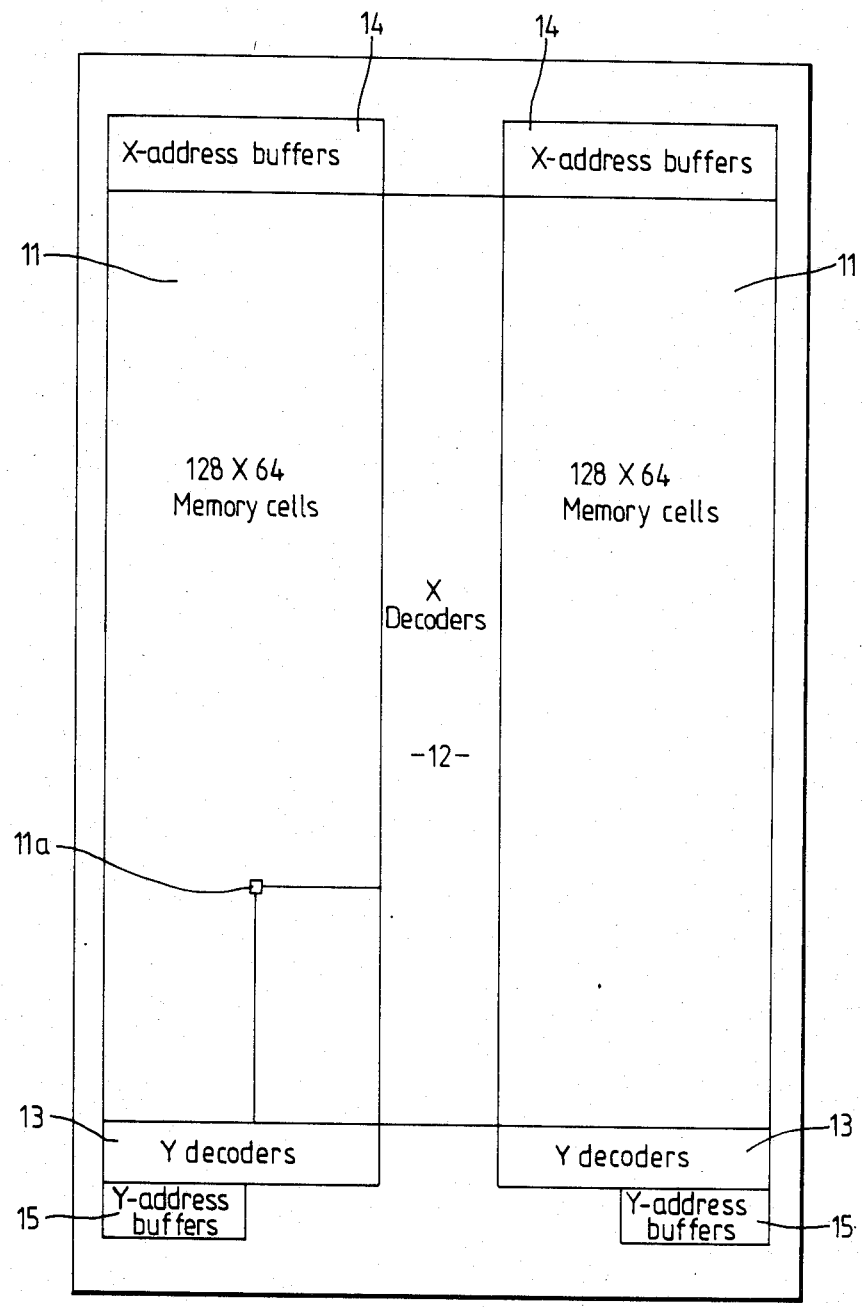
FIG. 1 is a schematic diagram of the memory layout.

Referring to FIG. 1, the memory, which comprises a static random access memory, includes two similar arrays of memory cells 11 having a columnar array of X-decoders 12 disposed therebetween. Two similar sets of Y-decoders 13 are disposed at the one end of the cell arrays 11. An individual memory cell 11a is accessed by providing the decoders 12 and 13 with the corresponding X and Y address via X-address and Y-address buffers 14 and 15 respectively. Note that FIG. 1 shows the physical rather than the electrical layout of the memory.

Typically, the memory is a 16K word by one bit memory with the memory cells physically arranged in two 128 by 64 arrays. Thus each array (11) has 128 X-decoders in the X-decoder array (12) and 64 Y-decoders in each of the Y-decoder arrays (13). This physical arrangement is the result of layout considerations. Electrically the array is not split in the Y direction.

Figure 2:
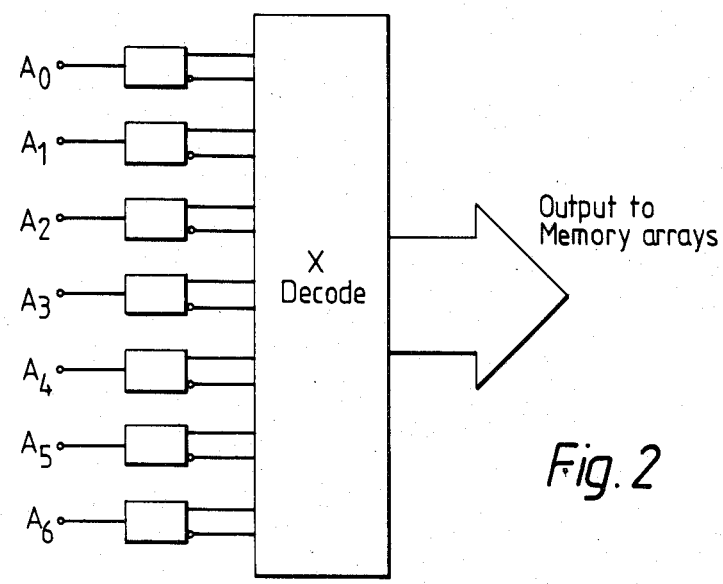
FIGS. 2 and 3 show the decoder circuitry employed in the memory of FIG. 1.
Figure 3:
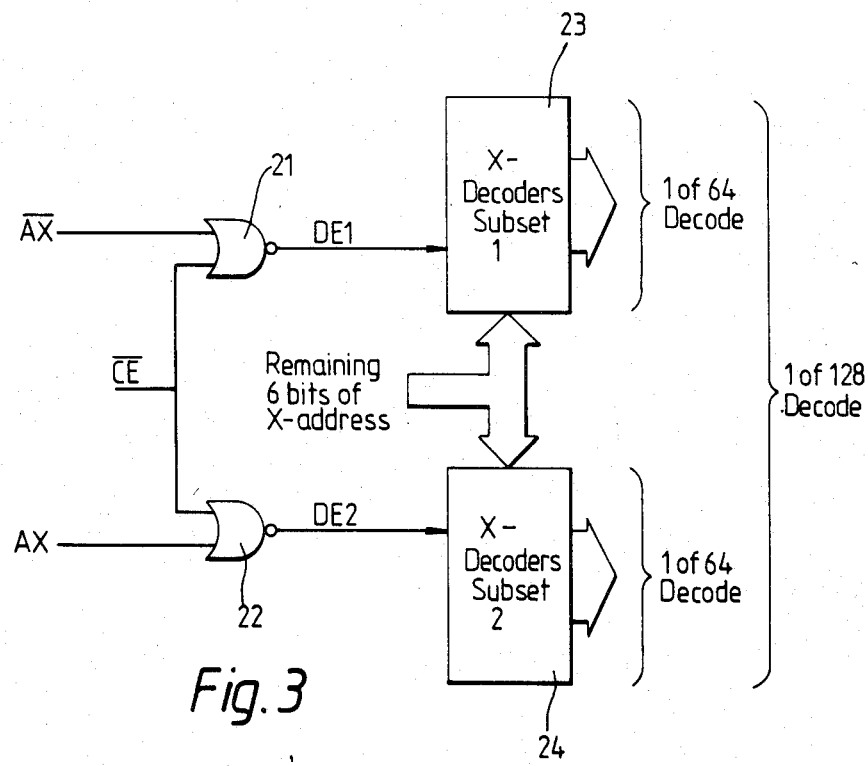

FIGS. 2 and 3 illustrate the operation of the X-decoder circuits. To access a particular row of the memory an X-address in the form of a seven bit binary code is fed to the X-address decoders which comprise two sets of 64 seven input NOR gates, one set being used for each memory array. The address inputs are shown schematically as $A_0$ to $A_6$ in FIG. 2. Six of these inputs receive row address information, i.e. bits $A_0$ to $A_5$, whilst the seventh, e.g. $A_6$, receives a decoder select bit $A_x$. Since there are, in the present case, a total of 128, i.e. $2^7$, rows of cells a seven bit binary signal contains sufficient information to define a particular row. Simultaneously with the X-address code a similar Y-address code is fed to the Y-decoders thereby defining the particular cell that is to be accessed.

The X-decoders are logically divided into two subsets (23,24) using the X-address (Ax) as the controlling bit. Selection of one or other of the memory arrays is effected via a pair of two input NOR gates 21,22 (FIG. 3). When a memory row is accessed a corresponding logic signal $A_x$ is applied to one input of one gate and its complement $\overline{A_x}$ is applied to one input of the other NOR gate. The other inputs of the NOR gates are coupled together and receive an enable signal CE, normally generated 'on chip', whereby power up and power down of the decoders is effected. The memory is held in a low power mode whilst the CE signal is high and reverts the normal operation when the CE signal is low. Thus an X-decoder array can be activated only during the period when the CE signal is in its low state. Under such conditions a high $A_x$ signal applied e.g. to the gate 21, and a corresponding low $\overline{A_x}$ signal applied to the gate 22 causes generation of a low decoder disable signal DE2 at the output of gate 22 and a high decoder enable signal DE1 at the output of gate 21. DE1 and DE2 are used to power up X-decoder sub-sets 1 and 2 respectively. If a Decoder Enable signal is high then the corresponding X-decoder sub-set is powered up. If DE is low then the corresponding X-decoder sub-set reverts to a low power standby mode. In operation, if CE is high then both DE1 and DE2 are constrained to be low and the X-decoders are powered down with the rest of the memory. If CE is low then the rest of the memory is powered up for normal operation. Under such conditions, e.g. a high Ax signal and a corresponding low Ax signal will result in the generation of a high DE1 signal and a low DE2 signal. Thus, for example, X-decoder sub-set 1 is powered up whilst sub-set 2 remains in low power standby. In this way only one of the decoder arrays corresponding to the required memory cell can be activated at any one time, and the decoder power requirements are thus effectively halved.

In a particularly advantageous arrangement the two arrays of X decoders are interleaved on the memory chip. This distributes the power dissipation and also minimises the effect of 'crosstalk' between adjacent decoders. It will of course be apparent to those skilled in the art that the physical division of the cells into two arrays does not correspond to their logical division into two or more sets of cells. It will also be clearly understood that although the arrangement is described with reference to the X-decoders where the greatest speed increase may be achieved it may also be applied to the Y-decoders.

Referring now to FIG. 4, the decoder circuit includes a plurality of field effect transistors, TR1, TR2 . . . TRN, one for each address input bit and each coupled between the circuit ground Vss and a decoding node DN. The arrangement is supplied via a current generator CG from a power supply Vcc, typically 5 volts.

A selected decoder has all its inputs low so that transistors TR1 to TRN are turned off and the decoding node DN is allowed to charge to its high level. In the absence of a voltage clamp this node would charge to the full circuit voltage, i.e. 5 volts, and, since the node has a relatively high capacitance, the charge time would have a significant effect on operating speed. Also discharging of the node from the full 5 volts is relatively slow and limits the speed of deselection of the decoder.

These effects are significantly reduced by the provision of a voltage clamp VC. This may comprise one or more series connected field effect transistors, each with its gate connected to its drain. In the present application two transistors TR21, TR22 are used to provide a clamping level of e.g. 3 volts. Consequently both selection and particularly deselection of the decoder are faster as the decoding node has to be charged to and discharged from only 3 volts, i.e. a voltage significantly lower than the circuit supply voltage.

With the voltage clamp the output from the decoder circuit to the following output buffer (not shown) is of course only 0–3 volts so the buffer is designed to operate from these reduced levels. The extra capacitance that this adds to the decoding node is relatively small. As a result there is an overall increase in the operating speed of the decoder circuit, particularly in the deselection speed. This reduces the risk of overlap of decoder outputs and thus provides improved data integrity in comparison with conventional decoder circuits.

Whilst the foregoing description refers to a memory with two arrays of cells it will be clear that the principles of operation described herein can be applied to memories with more than two cell arrays.

Typically the memories described herein will be used in computer and calculator applications where speed of access is a primary constraint on the memory design.

I claim:

1. A static random access memory comprising:
   at least two sets of memory cells;
   a plurality of row decoders each of said row decoder being operable to access memory cells in a corresponding one of said memory cell sets;
   power control means coupled to each of said plurality of row decoders for controlling power supplied to said plurality of decoders such that, when a memory cell is to be accessed, power is supplied from a power source only to the one row decoder of said plurality of row decoders corresponding to said memory cell, each row decoder of said plurality of row decoders comprising:
   a decoding node;
   circuit ground;
   a plurality of address inputs;
   a plurality of field effect transistors each coupled between said decoding node and said circuit ground and each having a control terminal coupled to a corresponding one of said address inputs; and
   a voltage clamp means for limiting the voltage at said decoding node to a value significantly less than the voltage of said power source.

2. A memory in accordance with claim 1, wherein said power control means includes a plurality of two input NOR gates one for each memory cell set, one input of each NOR gate receiving a power signal and the other input of each NOR gate receiving array select signals.

3. A memory in accordance with claim 1, wherein said memory cells are disposed in first and second arrays with said plurality of row decoders arranged in a columnar array therebetween.

4. A memory in accordance with claim 1 wherein said voltage clamp comprises:
   one or more field effect transistors each having its gate connected to its drain.

5. A memory in accordance with claim 1, which is fabricated by an n-channel HMOS process.

* * * * *